(12) United States Patent
Kawano et al.

(10) Patent No.: US 11,869,927 B2
(45) Date of Patent: Jan. 9, 2024

(54) METHOD OF MANUFACTURING SEMICONDUCTOR DEVICE

(71) Applicant: Tokyo Electron Limited, Tokyo (JP)

(72) Inventors: Yumiko Kawano, Nirasaki (JP); Genji Nakamura, Nirasaki (JP); Philippe Gaubert, Nirasaki (JP); Hajime Nakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 387 days.

(21) Appl. No.: 17/279,830

(22) PCT Filed: Sep. 19, 2019

(86) PCT No.: PCT/JP2019/036690
§ 371 (c)(1),
(2) Date: Mar. 25, 2021

(87) PCT Pub. No.: WO2020/066819
PCT Pub. Date: Apr. 2, 2020

(65) Prior Publication Data
US 2021/0399085 A1    Dec. 23, 2021

(30) Foreign Application Priority Data

Sep. 28, 2018   (JP) .................................. 2018-183304

(51) Int. Cl.
*H01L 21/02* (2006.01)
*H01L 49/02* (2006.01)
(52) U.S. Cl.
CPC ............ *H01L 28/56* (2013.01); *H01L 21/022* (2013.01); *H01L 21/0228* (2013.01);
(Continued)

(58) Field of Classification Search
CPC ............... H01L 28/56; H01L 21/02181; H01L 21/02189; H01L 21/022; H01L 21/0228;
(Continued)

(56) References Cited

U.S. PATENT DOCUMENTS

2011/0102968 A1* 5/2011 Choi ................. H01L 23/53261
427/79
2017/0103988 A1* 4/2017 Nishida ............... H01L 29/6684

FOREIGN PATENT DOCUMENTS

JP    H05267567 A    10/1993
JP    2012064631 A    3/2012
(Continued)

*Primary Examiner* — Marc Anthony Armand
(74) *Attorney, Agent, or Firm* — Armstrong Teasdale LLP

(57) ABSTRACT

A method of manufacturing a semiconductor device includes a first laminating step, a second laminating step, a third laminating step, a first annealing step, and a fourth laminating step. In the first laminating step, a first electrode film is laminated on a substrate. In the second laminating step, a capacitive insulator is laminated on the first electrode film. In the third laminating step, a metal oxide is laminated on the capacitive insulator. In the first annealing step, the first electrode film, the capacitive insulator, and the metal oxide, which are laminated on the substrate, are annealed. In the fourth laminating step, a second electrode film is laminated on the annealed metal oxide. The capacitive insulator is an oxide that contains at least one of zirconium and hafnium, and the metal oxide is an oxide that contains at least one of tungsten, molybdenum, and vanadium.

8 Claims, 3 Drawing Sheets

(52) U.S. Cl.
CPC .. *H01L 21/02181* (2013.01); *H01L 21/02189* (2013.01); *H01L 21/02321* (2013.01)

(58) Field of Classification Search
CPC ... H01L 21/02321; C23C 16/34; C23C 16/40; C23C 16/56
See application file for complete search history.

(56) References Cited

FOREIGN PATENT DOCUMENTS

| | | | |
|---|---|---|---|
| JP | 2012248813 | A | 12/2012 |
| JP | 2013058559 | A | 3/2013 |
| JP | 2014044993 | A | 3/2014 |
| JP | 2014229680 | A | 12/2014 |
| WO | 2010082605 | A1 | 7/2010 |

\* cited by examiner

| Thickness of metal oxide film(nm) | Presence/absence of swelling | |
|---|---|---|
| | Comparative Example | Embodiment |
| 0.48 | Absence | Absence |
| 0.96 | Presence | Absence |
| 1.45 | Presence | Absence |
| 2.42 | Presence | Absence |
| 3.39 | Presence | Absence |

METHOD OF MANUFACTURING SEMICONDUCTOR DEVICE

CROSS-REFERENCE TO RELATED APPLICATIONS

This application is a National Stage Application of International Patent Application No. PCT/JP2019/036690, having an International Filing Date of Sep. 19, 2019, which claims the benefit of priority to Japanese Patent Application No. 2018-183304, filed Sep. 28, 2018, the entire contents of each of which are hereby incorporated by reference herein.

TECHNICAL FIELD

Various aspects and embodiments of the present disclosure relate to a method of manufacturing a semiconductor device.

BACKGROUND

Patent Documents 1 to 7 below disclose a method of manufacturing a semiconductor device including a capacitor.

PRIOR ART DOCUMENTS

Patent Documents (Patent Document 1) Japanese Laid-Open Patent Publication No. 2014-229680
(Patent Document 2) Japanese Laid-Open Patent Publication No. 2014-044993
(Patent Document 3) Japanese Laid-Open Patent Publication No. 2013-058559
(Patent Document 4) Japanese Laid-Open Patent Publication No. 2012-248813
(Patent Document 5) Japanese Laid-Open Patent Publication No. 2012-064631
(Patent Document 6) International Publication No. WO2010/082605
(Patent Document 7) Japanese Laid-Open Patent Publication No. 05-267567

The present disclosure provides a method of manufacturing a semiconductor device capable of suppressing swelling and peeling of an electrode film on a metal oxide.

SUMMARY

According to an aspect of the present disclosure, a method of manufacturing a semiconductor device includes a first laminating step, a second laminating step, a third laminating step, a first annealing step, and a fourth laminating step. In the first laminating step, a first electrode film is laminated on a substrate. In the second laminating step, a capacitive insulator is laminated on the first electrode film. In the third laminating step, a metal oxide is laminated on the capacitive insulator. In the first annealing step, the first electrode film, the capacitive insulator, and the metal oxide, which are laminated on the substrate, are annealed. In the fourth laminating step, a second electrode film is laminated on the annealed metal oxide. The capacitive insulator is an oxide that contains at least one of zirconium and hafnium, and the metal oxide is an oxide that contains at least one of tungsten, molybdenum, and vanadium.

According to various aspects and embodiments of the present disclosure, it is possible to prevent swelling and peeling of an electrode film on a metal oxide.

DETAILED DESCRIPTION

Hereinafter, embodiments of a method of manufacturing a semiconductor device disclosed herein will be described in detail with reference to the drawings. The method of manufacturing a semiconductor device disclosed herein is not limited by the following embodiments.

As a structure of a semiconductor device such as a capacitor of a dynamic random access memory (DRAM), a metal-insulator-metal (MIM) structure in which a capacitive insulator is sandwiched between two metal electrode films is known. In a semiconductor device having such a structure, a capacitive insulator such as zirconia ($ZrO_2$) is laminated on the first metal electrode film, and a second metal electrode film is laminated on the capacitive insulator. Then, in order to increase the crystallinity of the capacitive insulator, the capacitive insulator sandwiched between the first metal electrode film and the second metal electrode film is annealed.

In order to form a dipole on the interface of the capacitive insulator to increase a barrier height, a metal oxide may be laminated on the capacitive insulator. When a capacitor having a structure in which a metal oxide is laminated on a capacitive insulator is manufactured, annealing is performed after the capacitive insulator, the metal oxide, and the second metal electrode film are laminated on the first metal electrode film, in order to increase the crystallinity of the capacitive insulator.

However, when the annealing is performed after the second metal electrode film is laminated on the metal oxide, a gap may be partially generated between the metal oxide and the second metal electrode film, and the second metal electrode film may swell. When the gap is partially generated between the metal oxide and the second metal electrode film, the contact between the metal oxide and the second metal electrode film becomes insufficient. In addition, when the gap is generated between the metal oxide and the second metal electrode film, the adhesion between the metal oxide and the second metal electrode film is lowered, and the second metal electrode film is easily peeled off from the metal oxide.

Therefore, the present disclosure provides a technique capable of suppressing swelling and peeling of the electrode film on the metal oxide.

[Method of Manufacturing Semiconductor Device]

Figure 1:
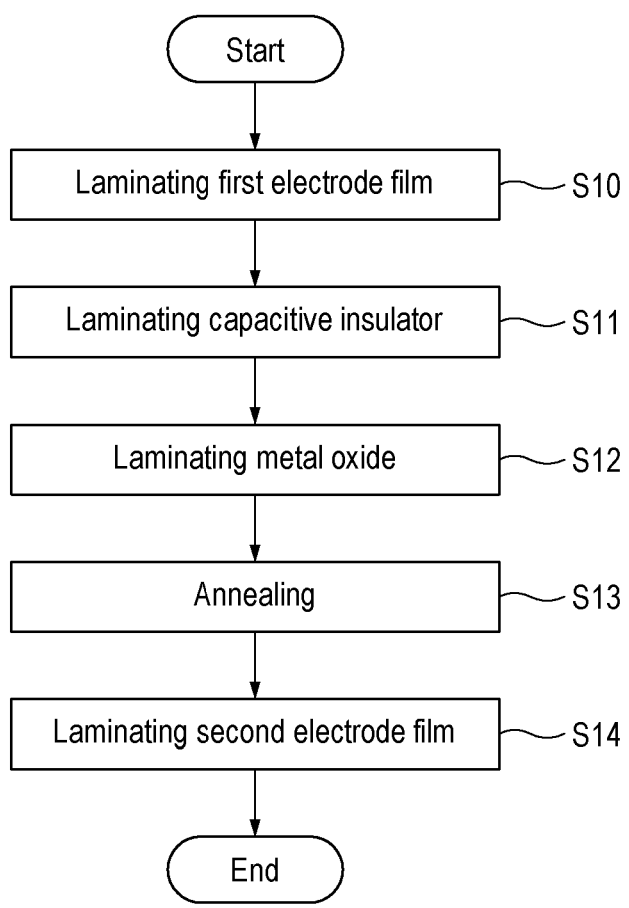
FIG. 1 is a flowchart illustrating an exemplary method of manufacturing a semiconductor device according to an embodiment of the present disclosure.

FIG. 1 is a flowchart illustrating an exemplary method of manufacturing a semiconductor device according to an embodiment of the present disclosure. FIGS. 2 to 5 are cross-sectional views each illustrating an exemplary state of a workpiece W in each step. The workpiece W manufactured by the method illustrated in this flowchart is used for manufacturing a semiconductor device.

Figure 2:
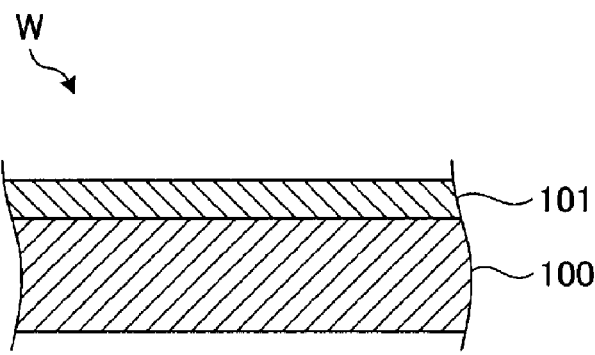
FIG. 2 is a view illustrating an exemplary process of manufacturing a semiconductor device.

First, a substrate 100 such as silicon is carried into a first film forming apparatus, and a first electrode film 101 is laminated on the substrate 100 (S10). Step S10 is an example of a first laminating step. In the present embodiment, the first electrode film 101 is, for example, titanium nitride (TiN). In step S10, the first electrode film 101 is formed on the substrate 100 through physical vapor deposition (PVD) performed in a nitrogen gas atmosphere using, for example, a titanium target. As a result, for example, as illustrated in FIG. 2, the workpiece W in which the first electrode film 101 is laminated on the substrate 100 is formed. Then, the workpiece W is carried out of the first film forming apparatus.

Next, the workpiece W is carried into a second film forming apparatus, and a capacitive insulator 102 is laminated on the first electrode film 101 (S11). Step S11 is an example of a second laminating step. In the present embodiment, the capacitive insulator 102 is, for example, zirconia. In addition, as another form, the capacitive insulator 102 may be hafnia (HfO$_2$) or may be an oxide containing zirconium (Zr) and hafnium (Hf).

Figure 3:
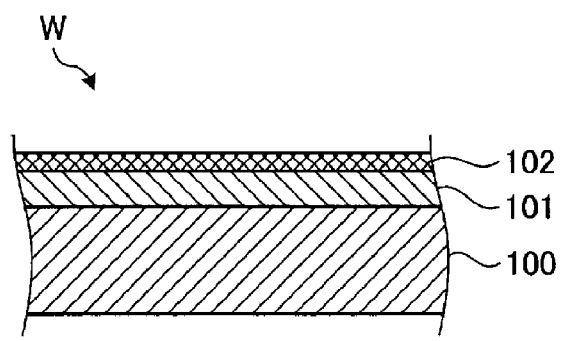
FIG. 3 is a view illustrating an exemplary process of manufacturing a semiconductor device.

In step S11, the capacitive insulator 102 is formed on the first electrode film 101 through, for example, atomic layer deposition (ALD) in which an adsorption step, a first purging step, a reaction step, and a second purging step are repeated. As a result, for example, as illustrated in FIG. 3, a workpiece W in which the first electrode film 101 and the capacitive insulator 102 are laminated on the substrate 100 is formed.

In the ALD in step S11, the temperature of the workpiece W is, for example, 250 degrees C., and the pressure in the second film forming apparatus is, for example, 1 Torr. In addition, exemplary main conditions of respective steps are as follows.
[Adsorption Step]
Raw material: tetrakis ethyl methyl amino zirconium (TEMAZ)
Processing time: 5 sec
[First Purging Step]
Purge gas: argon gas
Flow rate: 500 sccm
Processing time: 10 sec
[Reaction Step]
Reaction gas: oxygen gas/ozone gas
Flow rate: oxygen gas=500 sccm, concentration of ozone gas: 100 g/m$^3$
Processing time: 10 sec
[Second Purging Step]
Purge gas: argon gas
Flow rate: 500 sccm
Processing time: 10 sec Next, a metal oxide 103 is laminated on the capacitive insulator 102 in the second film forming apparatus (S12). Step S12 is an example of a third laminating step. In the present embodiment, the metal oxide 103 is, for example, tungsten oxide (WO$_x$). As another form, the metal oxide 103 may be, for example, molybdenum oxide (MoO$_x$), vanadium oxide (VO$_x$), or the like. In addition, the metal oxide 103 may be an oxide containing tungsten (W), molybdenum (Mo), and vanadium (V).

The metal oxide 103 may further contain a metal contained in the capacitive insulator 102. For example, when the capacitive insulator 102 contains zirconium, the metal oxide 103 may contain zirconium, and when the capacitive insulator 102 contains hafnium, the metal oxide 103 may contain hafnium.

Figure 4:
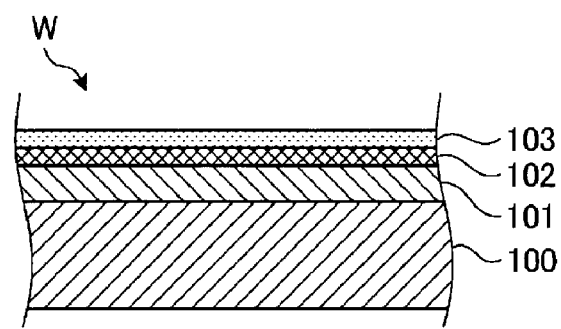
FIG. 4 is a view illustrating an exemplary process of manufacturing a semiconductor device.

In step S12, the metal oxide 103 is formed on the capacitive insulator 102 through, for example, ALD. As a result, for example, as illustrated in FIG. 4, a workpiece W in which the first electrode film 101, the capacitive insulator 102, and the metal oxide 103 are laminated on the substrate 100 is formed. Then, the workpiece W is carried out of the second film forming apparatus.

In the ALD in step S12, the temperature of the workpiece W is, for example, 300 degrees C., and the pressure within the second film forming apparatus is, for example, 1 Torr. In addition, exemplary main conditions of respective steps are as follows.
[Adsorption Step]
Raw material: amide tungsten
Processing time: 5 sec
[First Purging Step]
Purge gas: argon gas
Flow rate: 500 sccm
Processing time: 10 sec
[Reaction Step]
Reaction gas: oxygen gas
Flow rate: oxygen gas=500 sccm
Processing time: 10 sec
[Second Purging Step]
Purge gas: argon gas
Flow rate: 500 sccm
Processing time: 10 sec Next, the workpiece W is carried into an annealing apparatus, and the workpiece W is annealed at a predetermined temperature (S13). Step S13 is an example of the first annealing step. By annealing the workpiece W at a predetermined temperature, some of the metal atoms of the capacitive insulator 102 are replaced by some of the metal atoms of the metal oxide 103, and a dipole is formed at the interface between the capacitive insulator 102 and the metal oxide 103. This makes it possible to increase the barrier height of the capacitive insulator 102.

Here, the annealing atmosphere needs to be a non-reducing atmosphere, but it does not necessarily have to be an oxidizing atmosphere. The annealing atmosphere is preferably an inert atmosphere of, for example, argon gas or nitrogen gas. In addition, when the annealing temperature in step S13 is, for example, 400 degrees C. or lower, the capacitive insulator 102 is not crystallized. In addition, when the annealing temperature is, for example, 460 degrees C. or higher, the crystallization of the capacitive insulator 102 proceeds excessively. Therefore, the annealing in step S13 is preferably performed at a temperature in the range of, for example, 420 degrees C. or higher and 450 degrees C. or lower.

In addition, in step S13, in order to appropriately crystallize the capacitive insulator 102 at a temperature in the range of, for example, 420 degrees C. or higher and 450 degrees C. or lower, at a low temperature, annealing is preferably performed for a relatively long period of time, and at a high temperature, annealing is preferably performed for a relatively short time. For example, when the annealing is performed at 420 degrees C., the annealing is preferably performed for, for example, 60 minutes. For example, when the annealing is performed at 450 degrees C., the annealing is preferably performed for, for example, 2 minutes. Therefore, the annealing in step S13 is preferably performed in a time within the range of, for example, 2 minutes or more and 60 minutes or less.

Figures 5, 6:
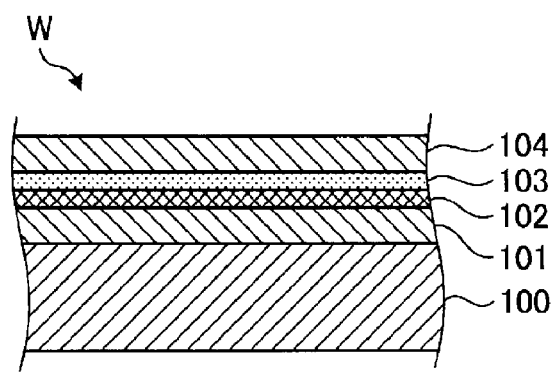
FIG. 5 is a view illustrating an exemplary process of manufacturing a semiconductor device.
FIG. 6 is a view showing exemplary results of a test for examining the presence/absence of swelling of a second electrode film.

Next, the workpiece W is carried into the first film forming apparatus, and a second electrode film 104 is laminated on the metal oxide 103 (S14). Step S14 is an example of the fourth laminating step. In this embodiment, the second electrode film 104 is, for example, titanium nitride (TiN). In step S14, the second electrode film 104 is formed on the metal oxide 103 through PVD performed in a nitrogen gas atmosphere using, for example, a titanium target. As a result, for example, as illustrated in FIG. 5, a workpiece W in which the first electrode film 101, the capacitive insulator 102, the metal oxide 103, and the second electrode film 104 are laminated on the substrate 100 is formed. Then, the workpiece W is carried out of the first film forming apparatus, and the method of manufacturing a semiconductor device illustrated in this flowchart is completed.

Here, in order to compare with the workpiece W manufactured by the manufacturing method of the present embodiment, workpieces of a comparative example were manufactured. In the comparative example, the workpieces W were annealed after a metal oxide 103 was laminated on a capacitive insulator 102 and a second electrode film 104 was laminated on the metal oxide 103. FIG. 6 is a view showing exemplary results of a test of examining the presence/absence of swelling of a second electrode film 104. In the test results shown in FIG. 6, the presence/absence of swelling was visually determined.

For example, as shown in FIG. 6, in the workpieces of the comparative example, swelling was observed in the second electrode film 104 when the thickness of the metal oxide 103 was 0.96 to 3.39 nm. When the thickness of the metal oxide 103 was 0.48 nm, no swelling was visually observed in the second electrode film 104. However, regardless of the thickness of the metal oxide 103, the adhesion between the metal oxide 103 and the second electrode film 104 was low in each of the workpieces of the comparative example, and the second electrode film 104 was easily peeled off.

In each of the workpieces in the comparative example, annealing is not performed before the second electrode film 104 is laminated, and annealing is performed after the second electrode film 104 is laminated. As a result, the metal oxide 103 reacts not only with the capacitive insulator 102 but also with the second electrode film 104 by annealing, and thus a gap is partially formed between the metal oxide 103 and the second electrode film 104. When the gap is partially generated between the metal oxide 103 and the second electrode film 104, the second electrode film 104 is swollen, and the contact between the metal oxide 103 and the second electrode film 104 becomes insufficient. In addition, when the gap is generated between the metal oxide 103 and the second electrode film 104, the adhesion between the metal oxide 103 and the second electrode film 104 is lowered, and the second electrode film 104 is easily peeled off.

In contrast, in each of the workpieces W manufactured by the manufacturing method of the present embodiment, for example, as shown in FIG. 6, no swelling of the second electrode film 104 was observed regardless of the thickness of the metal oxide 103, and the adhesion between the metal oxide 103 and the second electrode film 104 was also good.

In the method of manufacturing a semiconductor device of the present embodiment, each workpiece W is annealed after the metal oxide 103 is laminated on the capacitive insulator 102 and before the second electrode film 104 is laminated on the metal oxide 103. This makes it possible to suppress swelling and peeling of the second electrode film 104 laminated on the metal oxide 103 thereafter.

The first embodiment has been described above. The method of manufacturing a semiconductor device includes a first laminating step, a second laminating step, a third laminating step, a first annealing step, and a fourth laminating step. In the first laminating step, the first electrode film 101 is laminated on the substrate 100. In the second laminating step, the capacitive insulator 102 is laminated on the first electrode film 101. In the third laminating step, the metal oxide 103 is laminated on the capacitive insulator 102. In the first annealing step, the first electrode film 101, the capacitive insulator 102, and the metal oxide 103 laminated on the substrate 100 are annealed. In the fourth laminating step, the second electrode film 104 is laminated on the annealed metal oxide 103. The capacitive insulator 102 is an oxide that contains at least one of zirconium and hafnium, and the metal oxide 103 is an oxide that contains at least one of tungsten, molybdenum, and vanadium. This makes it possible to suppress the swelling and peeling of the second electrode film 104 on the metal oxide 103.

Further, in the embodiment described above, the first annealing step is performed in a non-reducing atmosphere, preferably in an inert atmosphere such as argon gas or nitrogen gas, and at a temperature within the range of 420 degrees C. or higher and 450 degrees C. or lower. This makes it possible to appropriately crystallize the capacitive insulator 102.

Further, in the above-described embodiment, when the capacitive insulator 102 contains zirconium, the metal oxide 103 may further contain zirconium. When the capacitive insulator 102 contains hafnium, the metal oxide 103 may further contain hafnium. This makes it possible to efficiently form a dipole at the interface between the capacitive insulator 102 and the metal oxide 103.

In addition, in the embodiment described above, the first electrode film 101 and the second electrode film 104 are made of titanium nitride. This makes it possible to form a capacitor.

[Others]

The technology disclosed herein is not limited to the embodiment described above, and various modifications are possible within the scope of the gist of the present disclosure.

For example, in the embodiment described above, the workpiece W is annealed before the second electrode film 104 is laminated on the metal oxide 103, but the technique disclosed herein is not limited thereto. For example, the workpiece W may be further annealed after the second electrode film 104 is laminated on the metal oxide 103. The annealing after the second electrode film 104 is laminated is an example of the second annealing step. This makes it possible to further improve the crystallinity of the capacitive insulator 102. Before the second electrode film 104 is formed, the capacitive insulator 102 and the metal oxide 103 have already been annealed and integrated. Thus, even if the workpiece W is annealed after the second electrode film 104 is laminated, the second electrode film 104 is not swollen or peeled off.

In the ALD of the metal oxide 103 in the embodiment described above, oxygen gas is used as the gas used in the reaction step, but the technique disclosed herein is not limited thereto. For example, as another form, ozone gas may be used in addition to oxygen gas in the reaction step of ALD of the metal oxide 103. However, when oxygen gas is used without using ozone gas in the reaction step of ALD of the metal oxide 103, it is possible to improve film thickness controllability in the thin film area of the metal oxide 103. Thus, it is possible to form a thin film of, for example, 5 Å or less. In addition, when oxygen gas is used without using ozone gas in the reaction step of ALD of the metal oxide 103, it is further possible to suppress oxidization of the first electrode film 101, which may be caused when ozone permeates the capacitive insulator 102 and reaches the first electrode film 101.

In the embodiment described above, the first electrode film 101 and the second electrode film 104 are formed through PVD, but the film forming method is not limited thereto. The first electrode film 101 and the second electrode film 104 may be formed through chemical vapor deposition (CVD), ALD, or the like.

In the embodiment described above, the capacitive insulator 102 and the metal oxide 103 are formed through ALD, but the film forming method is not limited thereto. These may be formed through CVD or the like.

It shall be understood that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

EXPLANATION OF REFERENCE NUMERALS

W: workpiece, 100: substrate, 101: first electrode film, 102: capacitive insulator, 103: metal oxide, 104: second electrode film

What is claimed is:

1. A method of manufacturing a semiconductor device, the method comprising:
   a first laminating step of laminating a first electrode film on a substrate;
   a second laminating step of laminating a capacitive insulator on the first electrode film;
   a third laminating step of laminating a metal oxide on the capacitive insulator;
   a first annealing step of annealing the first electrode film, the capacitive insulator, and the metal oxide, which are laminated on the substrate; and
   a fourth laminating step of laminating a second electrode film on the annealed metal oxide,
   wherein the capacitive insulator is an oxide that contains at least one of zirconium and hafnium,
   wherein the metal oxide is an oxide that contains at least one of tungsten, molybdenum, and vanadium, and
   wherein the first annealing step is performed after the third laminating step and before the fourth laminating step.

2. The method of claim 1, wherein the first annealing step is performed in an inert atmosphere at a temperature within a range of 420 degrees C. or higher and 450 degrees C. or lower.

3. The method of claim 2, further comprising:
   a second annealing step of annealing the first electrode film, the capacitive insulator, the metal oxide, and the second electrode film laminated on the substrate after the fourth laminating step.

4. The method of claim 3, wherein, when the capacitive insulator contains zirconium, the metal oxide further contains zirconium, and
   when the capacitive insulator contains hafnium, the metal oxide further contains hafnium.

5. The method of claim 4, wherein the first electrode film and the second electrode film are made of titanium nitride.

6. The method of claim 1, further comprising:
   a second annealing step of annealing the first electrode film, the capacitive insulator, the metal oxide, and the second electrode film laminated on the substrate after the fourth laminating step.

7. The method of claim 1, wherein, when the capacitive insulator contains zirconium, the metal oxide further contains zirconium, and
   when the capacitive insulator contains hafnium, the metal oxide further contains hafnium.

8. The method of claim 1, wherein the first electrode film and the second electrode film are made of titanium nitride.

* * * * *